United States Patent
Zhang et al.

(10) Patent No.: US 7,629,639 B2
(45) Date of Patent: Dec. 8, 2009

(54) NANOTUBE- AND NANOCRYSTAL-BASED NON-VOLATILE MEMORY

(75) Inventors: Yuegang Zhang, Cupertino, CA (US); Udayan Ganguly, Ithaca, NY (US); Edwin Kan, Saratoga, CA (US)

(73) Assignee: Intel Corporation, Santa Clara, CA (US)

( * ) Notice: Subject to any disclaimer, the term of this patent is extended or adjusted under 35 U.S.C. 154(b) by 160 days.

(21) Appl. No.: 11/599,643

(22) Filed: Nov. 14, 2006

(65) Prior Publication Data

US 2007/0064478 A1 Mar. 22, 2007

Related U.S. Application Data

(62) Division of application No. 11/174,128, filed on Jun. 30, 2005, now Pat. No. 7,262,991.

(51) Int. Cl.
 *H01L 27/108* (2006.01)
(52) U.S. Cl. .................. 257/317; 257/321; 257/E29.3; 257/E29.304
(58) Field of Classification Search ................ 257/315, 257/316, 317, 321, E29.299, E29.3, E29.304
See application file for complete search history.

(56) References Cited

U.S. PATENT DOCUMENTS

| | | | | |
|---|---|---|---|---|
| 6,664,027 | B2 | 12/2003 | Griffith et al. | |
| 7,262,991 | B2 * | 8/2007 | Zhang et al. | 365/185.01 |
| 2002/0098653 | A1 * | 7/2002 | Flagan et al. | 438/260 |
| 2004/0031975 | A1 * | 2/2004 | Kern et al. | 257/213 |
| 2005/0201149 | A1 * | 9/2005 | Duan et al. | 365/185.03 |
| 2006/0046383 | A1 * | 3/2006 | Chen et al. | 438/257 |
| 2006/0140009 | A1 * | 6/2006 | Lojek | 365/185.28 |
| 2006/0220094 | A1 | 10/2006 | Lokej | |
| 2007/0014151 | A1 | 1/2007 | Zhang et al. | |
| 2007/0105312 | A1 * | 5/2007 | Min | 438/257 |
| 2007/0155099 | A1 * | 7/2007 | Takata et al. | 438/257 |

FOREIGN PATENT DOCUMENTS

| | | |
|---|---|---|
| EP | 0001480275 A2 | 11/2004 |
| EP | 001526566 A2 | 4/2005 |
| JP | 0411111867 A | 4/1999 |
| JP | 2000-022005 A | 1/2000 |

(Continued)

OTHER PUBLICATIONS

Gao, Guanghua et al., "Energetics, Structure, Mechanical and Vibrational Properties of Single Walled Carbon Nanotubes (SWNT)", Caltech Foresight Institute, pp. 1-9.

(Continued)

*Primary Examiner*—Minh-Loan T Tran
(74) *Attorney, Agent, or Firm*—Blakely, Sokoloff, Taylor & Zafman LLP

(57) ABSTRACT

An embodiment is a transistor for non-volatile memory that combines nanocrystal and nanotube paradigm shifts. In particular an embodiment is a transistor-based non-volatile memory element that utilizes a carbon nanotube channel region and nanocrystal charge storage regions. Such a combination enables a combination of low power, low read and write voltages, high charge retention, and high bit density. An embodiment further exhibits a large memory window and a single-electron drain current.

8 Claims, 13 Drawing Sheets

FOREIGN PATENT DOCUMENTS

| | | |
|---|---|---|
| JP | 2000-340682 A | 12/2000 |
| JP | 2001-203382 A | 7/2001 |
| JP | 2004-048062 A | 2/2004 |
| JP | 2005-129708 A | 5/2005 |
| WO | WO 98/59375 | 12/1998 |
| WO | WO 2004/048923 A2 | 6/2004 |

OTHER PUBLICATIONS

Ganguly, Udayan et al., "Carbon Nanotube Based Non-Volatile Memory with Charge Storage in Metal Nanocrystals", School of EE and Computer Engineering, Cornell University, pp. 1-4.

McEuen, Paul L. et al., "Singled-Walled Carbon Nanotube Electrics", IEEE Transactions on Nanotechnology (2002), pp. 1-9.

* cited by examiner

NANOTUBE- AND NANOCRYSTAL-BASED NON-VOLATILE MEMORY

This is a Divisional Application of Ser. No. 11/174,128 as filed Jun. 30, 2005, now U.S. Pat. No. 7,262,991.

FIELD

Embodiments of the invention relate to non-volatile semiconductor memory and more specifically non-volatile semiconductor memory including a nanocrystal floating gate and nanotube channel.

BACKGROUND

Memory manufacturers are currently researching and developing the next generation of memory devices. One such development includes technology designed to replace current volatile and non-volatile memory technologies. Important elements of a successor include compactness, low price, low power operation, non-volatility, high density, fast read and write cycles, and long life.

Current memory technology is predicted to survive into 65 nanometer process generations. This survival is in part based on the successful integration of, for example, exotic storage, source and drain engineering, copper and low dielectric constant materials for the interconnect levels, and high dielectric constant materials for transistor gates. However, there will thereafter exist a need for new memory materials and technology, particularly for non-volatile memory.

As is well known in the art, Flash memory utilizes a floating gate to store charge indicative of a logical "0" or logical "1" memory state. The floating gate is located between a control gate and a substrate, and relies on hot electron injection and Fowler-Nordheim electron tunneling through a thin tunneling oxide between the floating gate and the substrate for charge injection. An electrical potential, usually between 10 and 13 volts, can be applied to the control gate to excite electrons through the tunneling oxide layer into the floating gate where they are thereafter trapped. The trapped electrons provide excess potential in addition to the potential applied at the control gate. Hence the current through the transistor channel in the substrate is a function of both the control gate voltage and the presence/absence of charge in the floating gate. In other words, the compounded effect of the stored charge and the control gate voltage sets the resistance in the current channel, controlling the current flow through it. A cell sensor (external circuitry) monitors the potential drop across the current channel in the substrate which is controlled by the resistance of the channel to the current flow. If, for example, the resistance through the gate is greater than a set threshold value in Ohms, it has a logical value of "1." If the resistance drops below the threshold, the logical value changes to "0." The non-volatility of the memory depends on how securely the electrons are trapped in the floating gate. Among other defects, weak spots in the tunneling oxide (in particular as the tunneling oxide thickness decreases) may enable a filament current that will discharge the entire floating gate and render the device useless as a non-volatile memory element as the floating gate will be unable to store charge for any useful duration which leads to product reliability concerns.

Nanocrystals have been introduced as a paradigm to increase tunneling oxide reliability of Flash memory by dividing a monolithic floating gate into a set of discretely spaced floating gates. In the event of a weak spot or defect in the tunneling dielectric, this discreteness allows the discharge of only the floating gate directly over the defect. The rest of the floating gates are unaffected by the defect instead of the catastrophic leakage of all stored charge from a monolithic floating gate.

Another paradigm shift involves the use of carbon nanotubes in electronic applications. In particular, single-walled carbon nanotubes (SWNTs) are nanometer scale cylindrical tubes that are rolled from a single graphene sheet that can either be grown from a carbon source with the help of a catalyst. Nanotubes can have various crystal orientations and diameters which produces a variety of electronic band structures. Thus, SWNT can either metallic or semiconducting. As a semiconductor, a SWNT or multiple SWNTs can replace the semiconductor (e.g., silicon substrate) in a metal oxide semiconductor field effect transistor (MOSFET) structure. Such devices are also called carbon nanotube field effect transistors (CNFETs). However, while the promise of SWNTs in electronics applications theoretically impressive, SWNT-based electronic manufacturability offers significant hurdles to commercial practicability.

DETAILED DESCRIPTION

Figure 1:
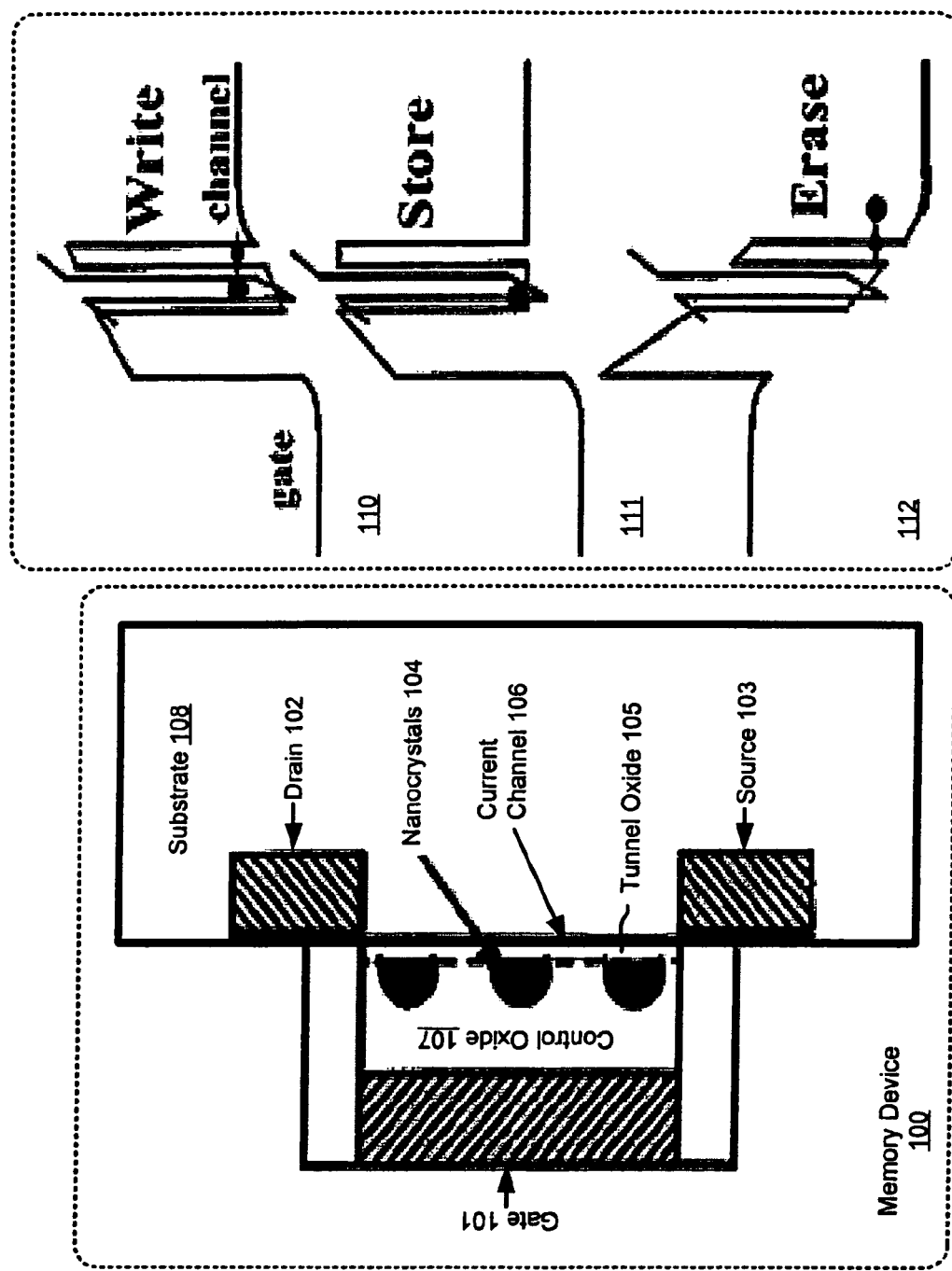
FIG. 1: illustration of a substrate cross section of a silicon nanocrystal memory device including 1-dimensional band diagrams for write, store, and erase functions of the silicon nanocrystal memory device

Embodiments of a nanotube- and nanocrystal-based non-volatile memory and method of manufacture thereof will be described. Reference will now be made in detail to a description of these embodiments as illustrated in the drawings. While the embodiments will be described in connection with these drawings, there is no intent to limit them to drawings disclosed herein. On the contrary, the intent is to cover all alternatives, modifications, and equivalents within the spirit and scope of the described embodiments as defined by the accompanying claims.

Simply stated, an embodiment is a non-volatile memory that combines nanocrystal and carbon nanotube paradigm shifts. In particular an embodiment is a transistor-based non-volatile memory element that utilizes a nanotube channel region and nanocrystal charge storage regions. Such a combination enables a combination of low power, low read and write voltages, high charge retention, and high bit density. An embodiment further exhibits a large memory window and effective control over the drain current by a single electron stored in the nanocrystals.

As noted, current Flash memory utilizes a continuous floating gate to store charge. When there are weak spots in the tunneling oxide (often caused by manufacturing non-uniformity), a filament current discharges the floating gate and the device becomes inoperable to store a distinguishable logical "1" or logical "0" state. As noted, an approach to mitigate this problem is to break the floating gate into multiple discrete charge storage regions so that one weak tunneling oxide location will not discharge the entire floating gate. On a small enough scale, the discrete charge storage regions are nanocrystals. The nanocrystals are often arranged in a two-dimensional format. The charge stored in a nanocrystal has a local effect on the channel current in the substrate. Far away from the nanocrystal, the effect of the stored charge drops off, decreasing the effect of the charged nanocrystal on the local resistance of the channel. Electrical current prefers a low resistance path. Hence there may be a preferred percolation current pattern through the two-dimensional nanocrystal array controlled substrate current channel region that affects the device performance adversely.

As introduced, carbon nanotubes, and in particular single-walled carbon nanotubes have become increasingly popular for both their mechanical and electrical properties. One approach has been to use the carbon nanotube as the semiconductor for the channel region of the transistor. Carbon nanotubes have increased carrier mobility versus bulk silicon (i.e. higher conductivity normalized to cross sectional area) and further exhibit higher current density than bulk silicon. Further, carbon nanotubes are naturally small and easy to control with an electric field. Said differently, a carbon nanotube can be compared to a highway with only one lane that can be easily blocked and unblock to control the traffic thereon. This is particularly useful to improve the sensitivity of the channel region of the carbon nanotube nanocrystal memory device of an embodiment and resulting memory window thereof. Further the carbon nanotube, with only one conduction dimension, mitigates the percolation current challenge of the two-dimensional array of the nanocrystals as discussed above.

FIG. 1 illustrates a substrate cross section of a silicon nanocrystal memory device 100 including a gate 101, drain 102, source 103, silicon nanocrystals 104, tunnel oxide 105, current channel 106 in the silicon substrate 108 and control oxide 107. The silicon nanocrystal 104 floating gate (scale increased for illustration only) is located between the control oxide 107 and the tunnel oxide 105, and relies on hot electron injection and Fowler-Nordheim electron tunneling through the thin tunnel oxide 105 to accumulate and disperse charge. An electrical potential, usually between 10 and 13 volts, can be applied to the gate 101 to excite electrons through the tunnel oxide 105 layer where they are thereafter trapped in the silicon nanocrystal 104 floating gate. The trapped electrons act as an additional source of electrical potential between the gate 101 and the current channel in the silicon substrate 108, the extent of the source of the potential (i.e., the amount of stored charge) to determine the logical state of the silicon nanocrystal memory device 100. FIG. 1 also illustrates one-dimensional band diagrams for write 110, store 111, and erase 112 functions of the silicon nanocrystal memory device 100. The silicon nanocrystals 104, however, exhibit many interface states, and are subsequently unstable and highly sensitive to back end processing steps. In other words, despite theoretical promise, the silicon nanocrystal memory device is difficult in production with high parametric yield.

Figure 2:
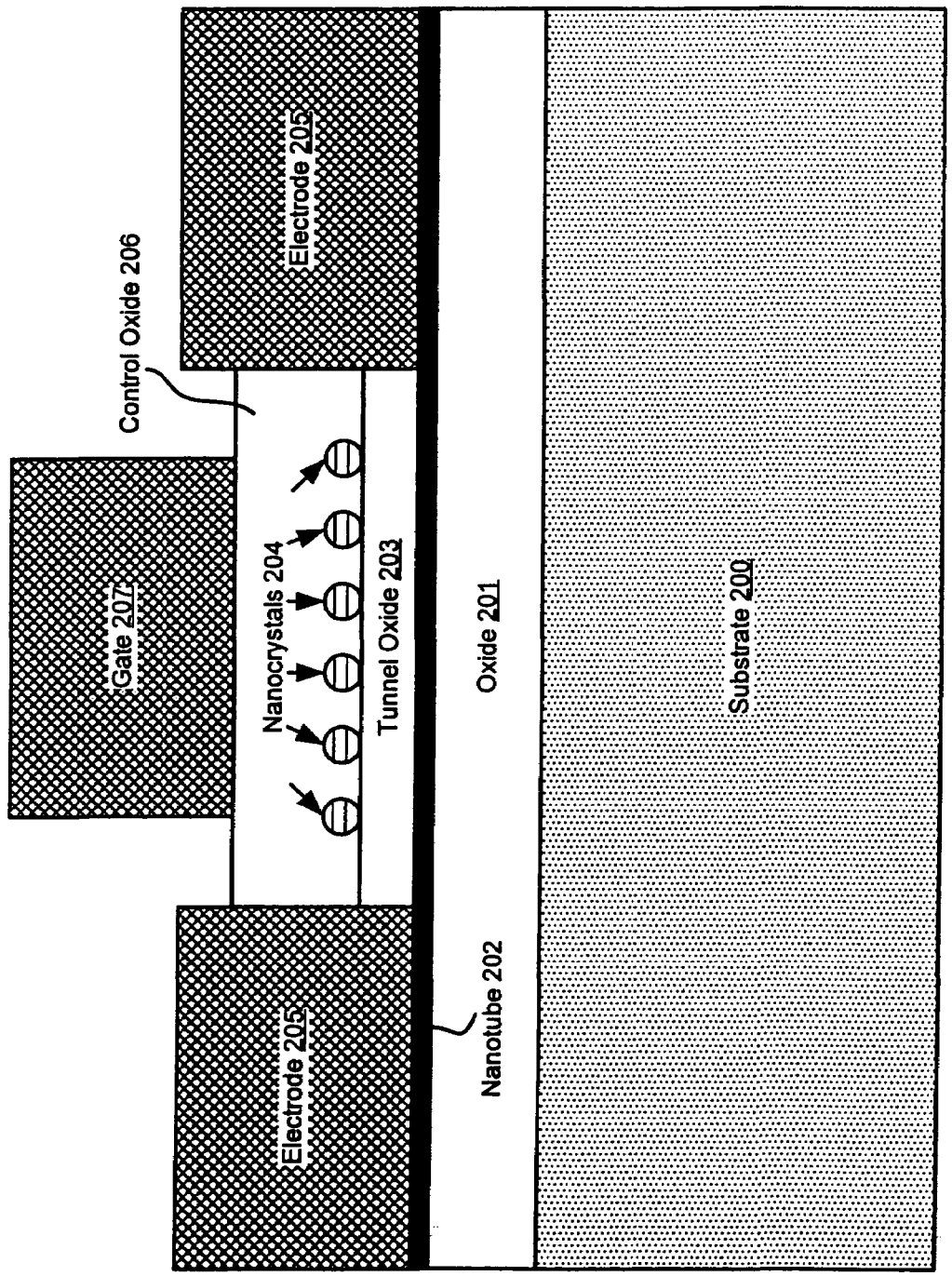
FIG. 2: schematic illustration of a substrate cross section of a nanotube, nanocrystal non-volatile memory of an embodiment

FIG. 2 is a schematic illustration of a substrate 200 cross section of a carbon nanotube nanocrystal memory of an embodiment, the details of which will follow with respect to FIGS. 3 through 13 and the discussion directed thereto. In an embodiment, substrate 200 is n+ silicon. Formed on the substrate 200 is a dielectric 201, in an embodiment silicon dioxide. A carbon nanotube 202 is formed on the dielectric 201 and operates as a channel region. Metal electrodes 205 provide electrical contacts to the carbon nanotube 202 at two separate locations. Nanocrystals 204 are formed adjacent to the carbon nanotube 202 and between electrodes 205. The nanocrystals 204 operate as a floating gate as they are separated from the carbon nanotube 202 by a tunnel oxide 203. The structure further includes a gate 207 separated from the nanocrystals 204 by a control oxide 206.

In operation, the carbon nanotube 202 is a one-dimensional conductor spanning the electrodes 205. The conductivity of the carbon nanotube 202 depends in part on the charge stored by the nanocrystals 204 functioning as an array of discrete floating gates adjacent to the carbon nanotube 202. The nanocrystals 204 operating as a floating gate can be compared to a valve that controls the flow of charge carriers through the carbon nanotube 202. Said alternatively, based on the amount of current that the nanocrystal 204 floating gate allows through the carbon nanotube 202, external circuit elements (not illustrated) can determine if the nanotube nanocrystal floating gate memory of an embodiment is storing a logical "1" or a logical "0." Further, as the carbon nanotube 202 is one-dimensional, the preferred percolation current of a two-dimensional nanocrystal array on a two dimensional current channel in the silicon substrate as introduced above is substantially eliminated.

Figure 3:
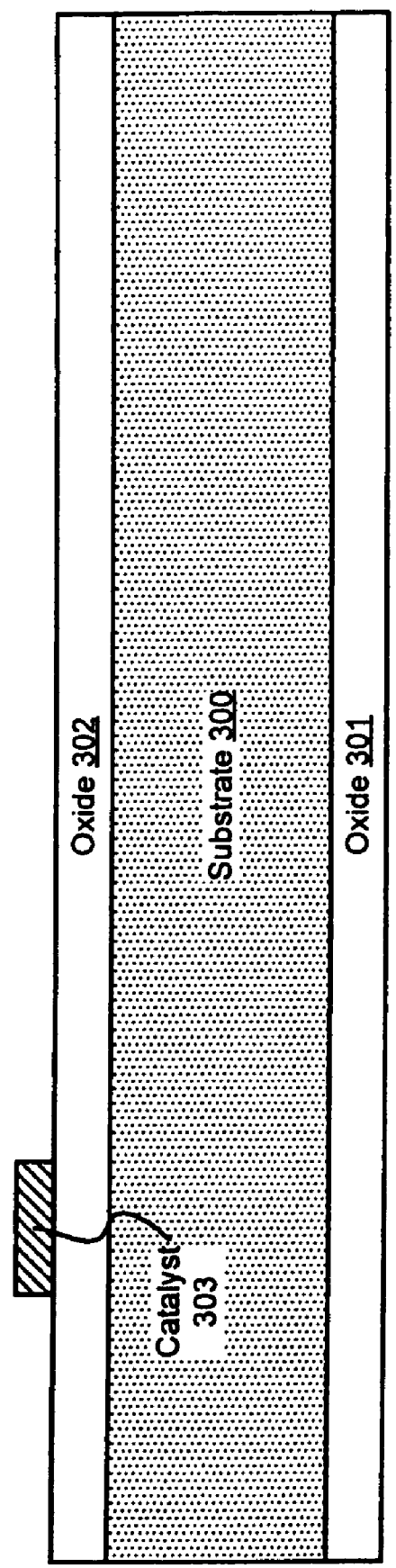
FIG. 3: illustration of a substrate cross section of an embodiment following the formation of oxide and a catalyst

FIG. 3 illustrates a substrate 300 cross section following the formation of oxide 301, oxide 302 and a catalyst 303. In an embodiment, the substrate is silicon and oxide 301 and 302 are silicon dioxide. The catalyst 303 of an embodiment comprises a transition metal (e.g., iron, nickel, cobalt, yttrium, lanthanum, or a metal alloy such as cobalt-molybdenum). In an embodiment for which the catalyst 303 is iron, the catalyst 303 is formed by a chemical reaction involving a solution of $FeCl_2$. The $FeCl_2$ solution may further include a porous support material so that, during formation, the plurality of catalysts 303 are properly separated on the substrate 300 (assuming that there will be many such memory elements of an embodiment fabricated on the same substrate). In an embodiment the porous support material is $Al_2O_3$. When the substrate 300 including the $FeCl_2$ is heated (with or without the porous support material), the $FeCl_2$ decomposes to form catalyst 303. In an embodiment the catalyst 303 is a metal nanoparticle. In an alternate embodiment the catalyst 303 is formed by depositing an organic material. In a further embodiment, the catalyst 303 is formed by depositing a protein, for example a hemoglobin-like protein that contains iron oxide. Subsequent exposure to hydrogen reduces the iron oxide in the protein to form iron. In an embodiment, the catalyst 303 is a metal nanoparticle with a diameter approximately between 1 and 10 nanometers.

Figure 4:
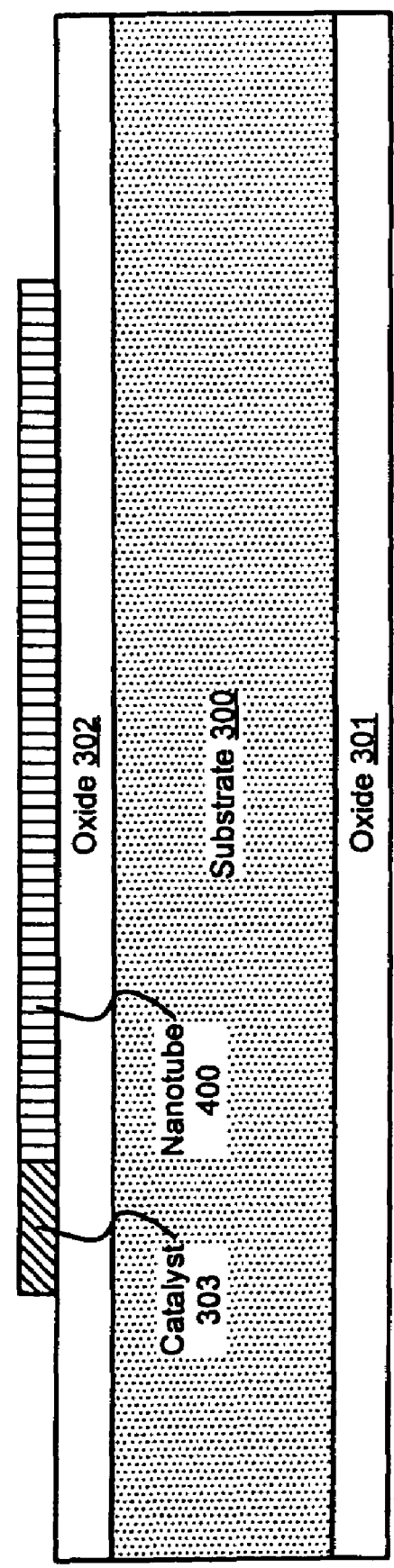
FIG. 4: illustration of the substrate cross section of FIG. 3 following the growth of a nanotube adjacent to the catalyst

FIG. 4 illustrates the substrate 300 cross section of FIG. 3 following the growth of a nanotube 400 adjacent to the catalyst 303. In an embodiment, the nanotube 400 is a carbon nanotube. In a further embodiment, the nanotube 400 is a single wall carbon nanotube. To grow the nanotube 400 of an embodiment, the catalyst 303 is exposed to a hydrocarbon gas. The hydrocarbon gas, in an embodiment methane, is heated until it decomposes, at which point the decomposed carbon will interact with the catalyst 303 metal. Once the catalyst 303 is saturated by carbon, the carbon will precipitate out of the catalyst 303, forming a substantially pure carbon precipitate based on a preferred lower energy carbon-carbon bond. Furthermore, the carbon forms, again based on a preferred lower energy state, a nanotube 400 as it precipitates. In an embodiment, the nanotube 400 has a diameter of approximately between 1 and 4 nanometers.

In addition to the direct growth method described in FIG. 3 and FIG. 4, pre-grown and purified SWNTs can be dissolved in a liquid solution and then be deposited on the substrate 300. A nanotube 400 formed by such a manner could further be aligned with methods utilizing surface tension or electric fields.

Figure 5:
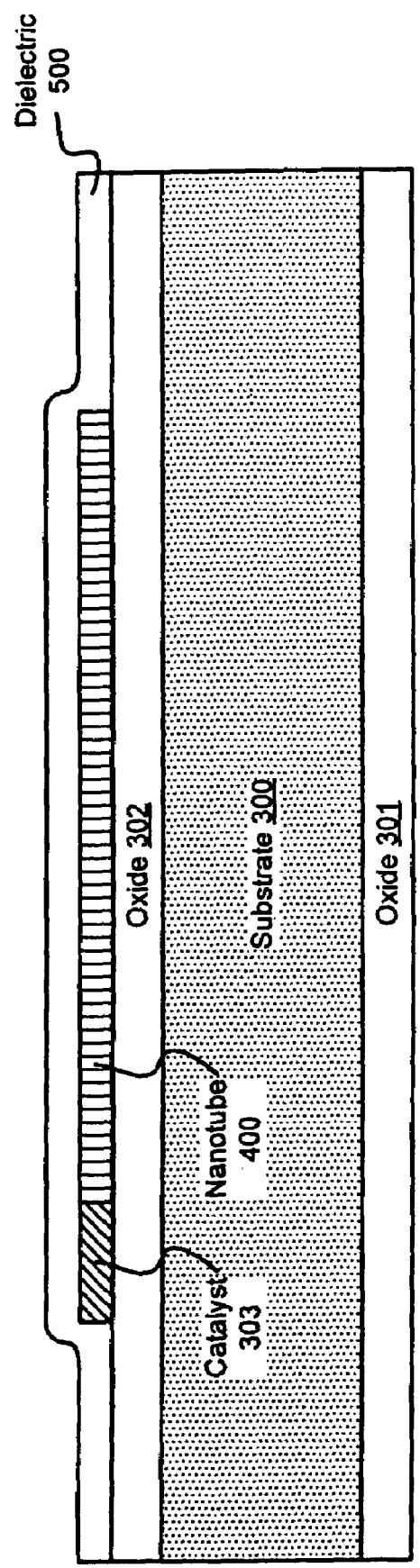
FIG. 5: illustration of the substrate cross section of FIG. 4 following the formation of the tunneling dielectric

FIG. 5 illustrates the substrate 300 cross section of FIG. 4 following the formation of a dielectric 500. The dielectric 500 of an embodiment has a dielectric constant equal to or greater than the dielectric constant of silicon dioxide (i.e., a "high-k" dielectric). In an embodiment, the dielectric 500 is silicon dioxide or hafnium oxide. The dielectric 500 may be deposited by any method known in the art to deposit the dielectric 500 material. In an embodiment, the dielectric 500 is approximately between 1 and 10 nanometers thick.

Figure 6:
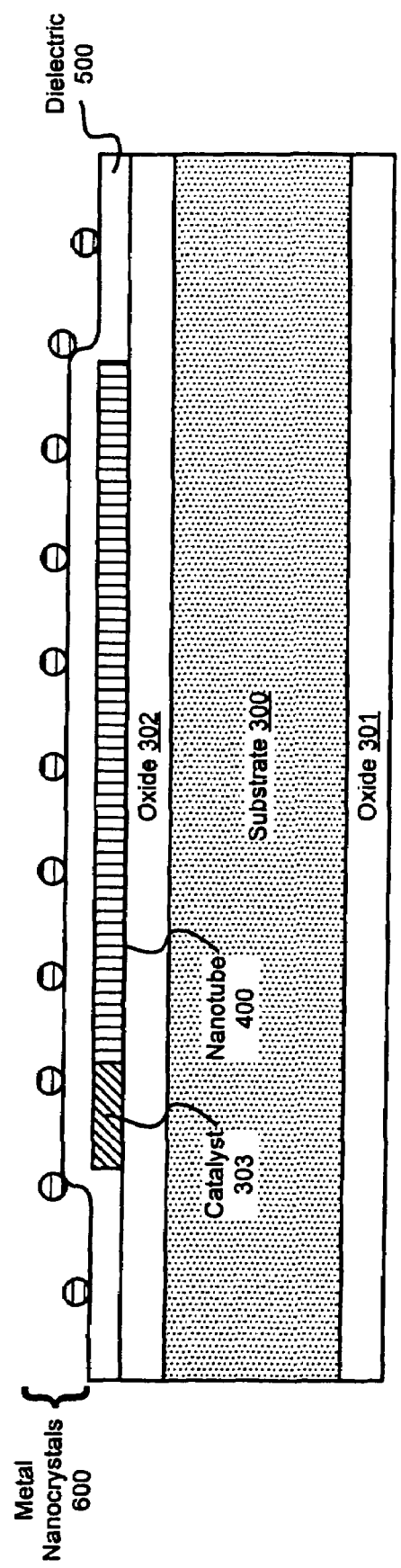
FIG. 6: illustration of the substrate cross section of FIG. 5 following the formation of nanocrystals

FIG. 6 illustrates the substrate 300 cross section of FIG. 5 following the formation of metal nanocrystals 600. The free electrons of the metal screen electron traps allowing a more stable Fermi energy versus, for example, silicon nanocrystals 104 utilized by the memory device 100 illustrated by FIG. 1. Further, there are many choices of metal species from which to choose to select a Fermi energy (and corresponding work function between the metal and the semiconductor) that in turn can alter the duration the nanocrystals retain stored charge. Further, the metal can be selected to be compatible with the chosen dielectric material comprising either the tunneling or control dielectric layers (i.e., dielectric 500 and dielectric 700 respectively) in the memory device.

The metal nanocrystals 600 will collectively function as a floating gate to store charge as described with reference to FIG. 2. The metal nanocrystals 600 of an embodiment are formed by first depositing a blanket layer of metal on the dielectric 500. In an embodiment, the blanket layer of metal is approximately one to few nanometers thick. The blanket layer of metal can be deposited by any method known to deposit high quality, very thin metal films. The substrate 300 is thereafter annealed, at which time the metal nanocrystals 600 nucleate. The free energy increase due to interfacial energy or surface energy is known as the capillary effect or the Gibbs-Thompson effect. This is a main force that contributes to particle coarsening or "Ostwald Ripening" that drives formation of the metal nanocrystals 600 of an embodiment from the blanket layer of metal.

The metal nanocrystal 600 size and distribution depend on, among other features, the wetting characteristics of the surface on which the blanket layer of metal is deposited (here, the dielectric 500), the thickness of the blanket layer of metal, the temperature of the anneal, the duration of the anneal, and the metal material itself. Annealing parameters vary from no annealing to rapid thermal annealing up to 600° C. for a few seconds duration in inert ambience. In an embodiment, the metal is gold and each metal nanocrystal 600 sphere subsequently formed is approximately 5 nanometers in diameter. Accordingly (and based on the thickness of the preceding blanket layer of metal) the distance between the center of a metal nanocrystal 600 and the center of an adjacent metal nanocrystal 600 is approximately 15 nanometers, leading to a metal nanocrystal 600 density of approximately $10^{12}$ nanocrystals per square centimeter.

Figure 7:
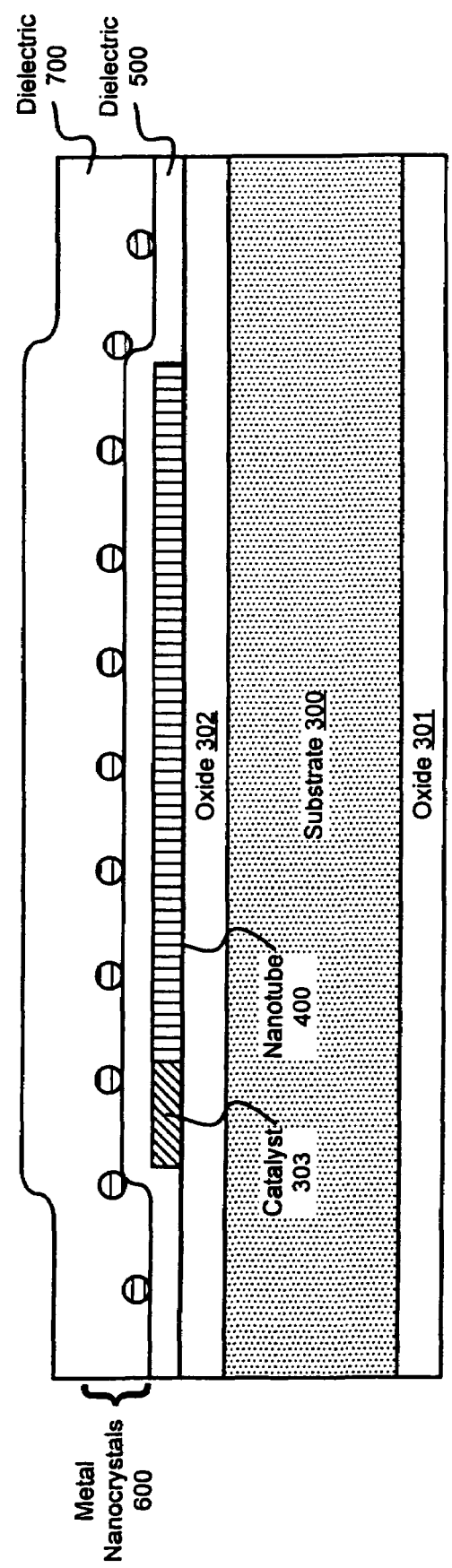
FIG. 7: illustration of the substrate cross section of FIG. 6 following the formation of a control or passivation oxide

FIG. 7 illustrates the substrate 300 cross section of FIG. 6 following the formation of a passivation dielectric 700. The passivation dielectric 700 of an embodiment is silicon dioxide, silicon nitride, or any other dielectric material known in the art to passivate. The passivation dielectric 700 further fixes the location and size of the metal nanocrystals 600 as they would otherwise continue to conglomerate and increase in size with any high temperature process subsequently experienced. The passivation dielectric 700 further functions as the control dielectric in an embodiment including top gate electrode 1100 as discussed below.

Figure 8:
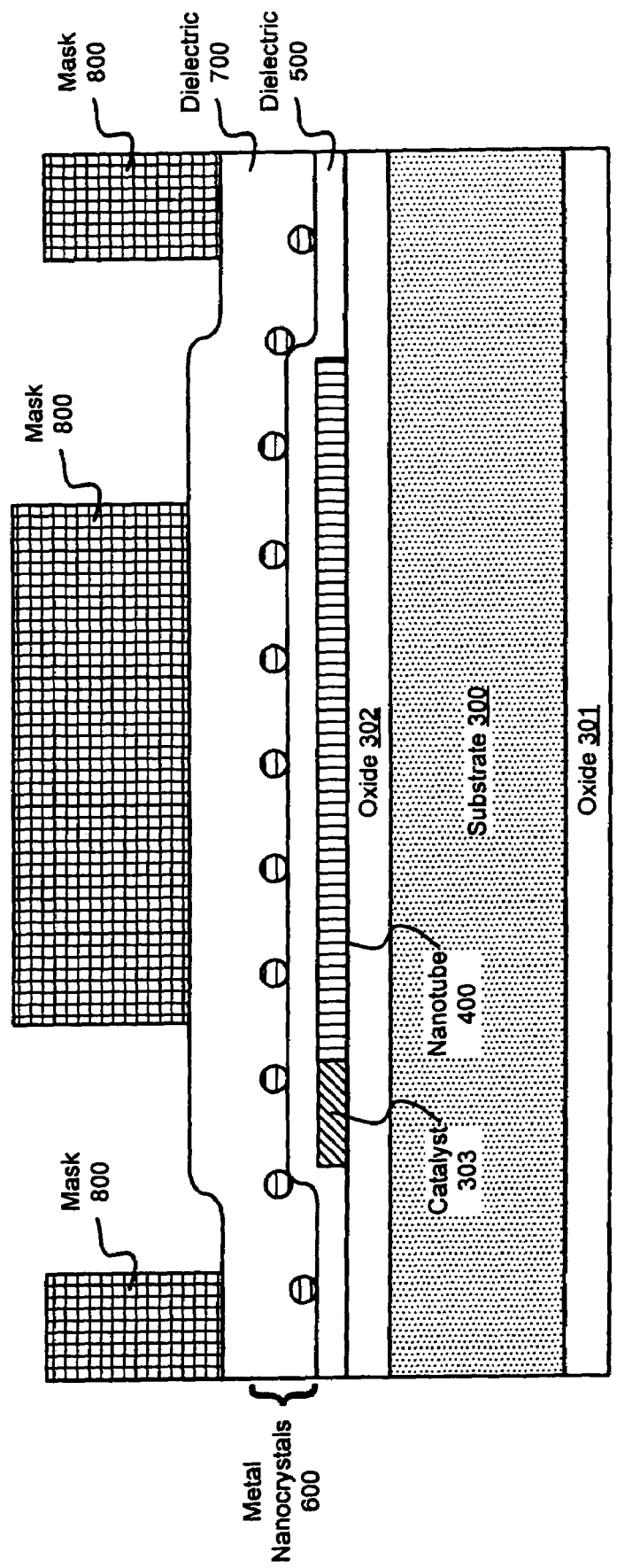
FIG. 8: illustration of the substrate cross section of FIG. 7 following the formation and patterning of a mask for a source and drain metal electrode etch

FIG. 8 illustrates the substrate 300 cross section of FIG. 7 following the formation and patterning of an electrode etch mask 300. The mask 300 can be any material (e.g., photoresist, silicon nitride, or silicon carbide) that substantially withstands the electrode etch through the passivation dielectric 700 and dielectric 500. The etch of an embodiment is a material-appropriate etch such as TMAH or equivalent alkali-based etch for exposed photoresist. The regions etched by the electrode etch will allow subsequent contact to the nanotube 400.

Figure 9:
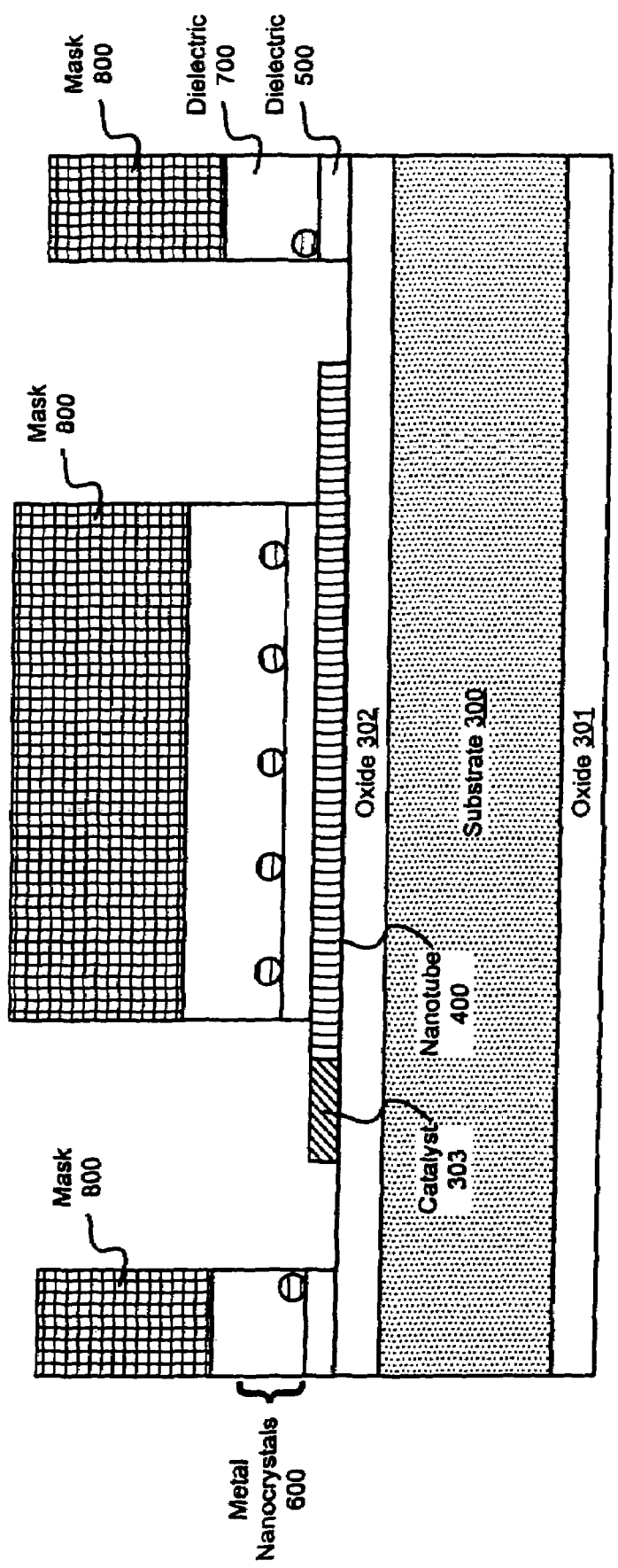
FIG. 9: illustration of the substrate cross section of FIG. 8 following a source and drain etch

FIG. 9 illustrates the substrate 300 cross section of FIG. 8 following an electrode etch as patterned by the mask 300. The electrode etch is selective in that it etches the dielectric 700 and the dielectric 500 to open contacts to the nanotube 400, but substantially does not etch the nanotube 400.

Figure 10:
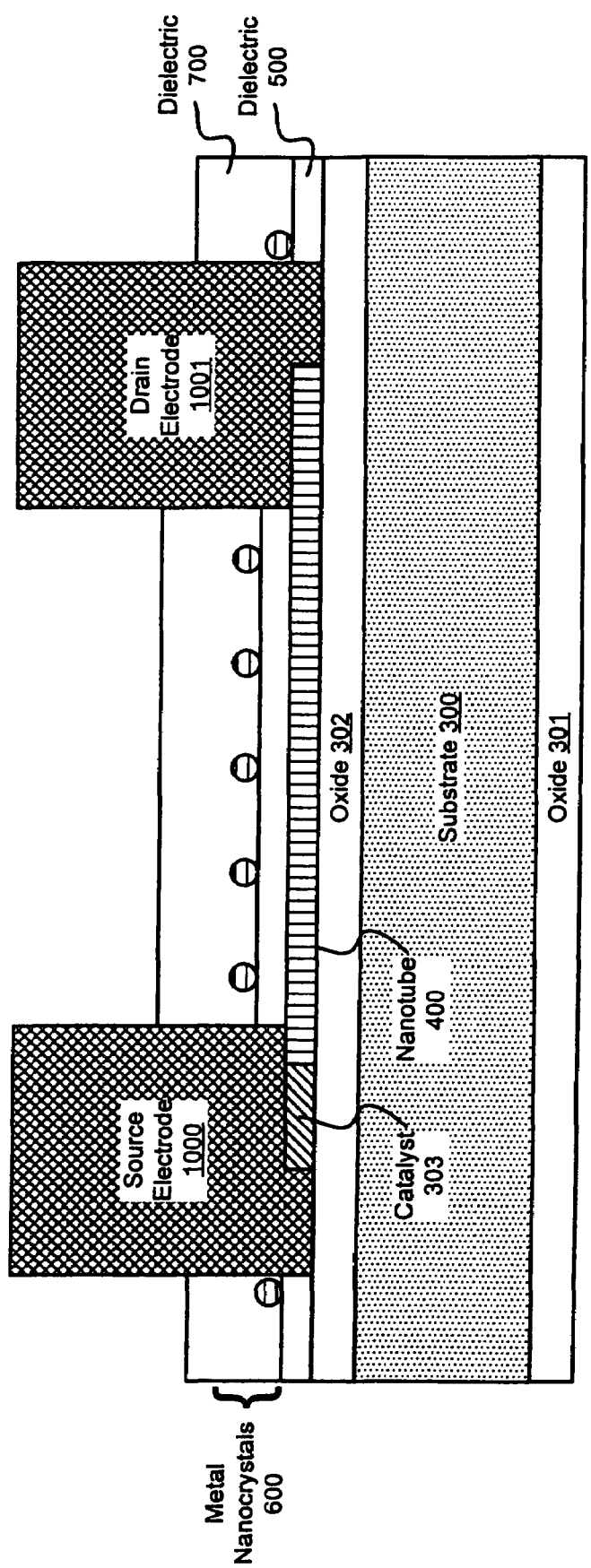
FIG. 10: illustration of the substrate cross section of FIG. 9 following the formation of source and drain electrodes

FIG. 10 illustrates the substrate cross section of FIG. 9 following the formation of source electrode 1000 and drain electrode 1001. Further, the mask 300 has been removed by a selective etch so as to not damage the passivation dielectric 700 underlying the mask 300. In an embodiment, the source electrode 1000 and drain electrode 1001 are tungsten, aluminum, or a silicide. The source electrode 1000 and drain electrode 1001 may be selected, at least in part, by a target resistivity, work function, or temperature budget. In a further embodiment (not illustrated), the formation of the source electrode 1000 and drain electrode 1001 is preceded by the formation of a titanium or tantalum barrier to both prevent the source electrode 1000 and drain electrode 1001 from contaminating adjacent materials and to improve the adhesion of the source electrode 1000 and drain electrode 1001.

Figure 11:
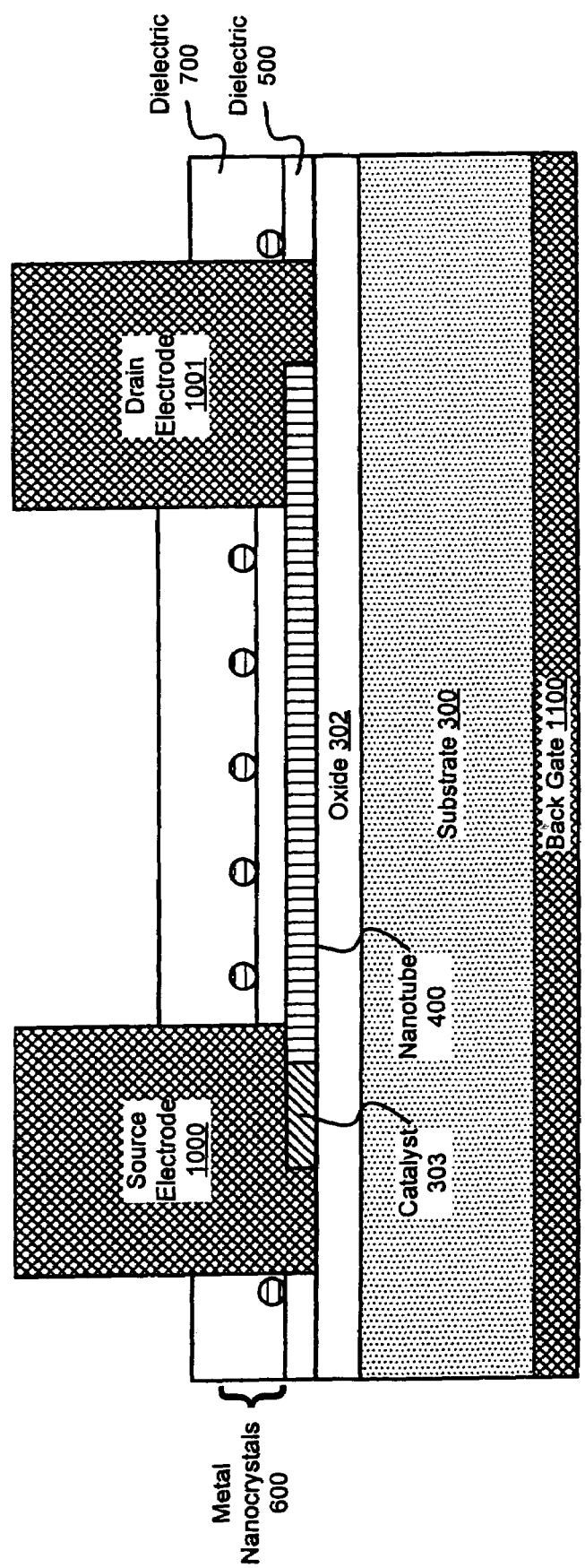
FIG. 11: illustration of the substrate cross section of FIG. 10 following the formation of a back gate

FIG. 11 illustrates the substrate 300 cross section of FIG. 10 following the formation of a back gate 1100. In an embodiment, the back gate 1100 is tungsten, aluminum, or a silicide. The back gate 1100, in combination with the source electrode 1000 and/or drain electrode 1001, generates the electric field that causes the electrons to tunnel through the dielectric 500 layer to the metal nanocrystals 600 or to tunnel from the metal nanocrystals 600 through the dielectric 500 layer depending on a write or erase cycle.

Figure 12:
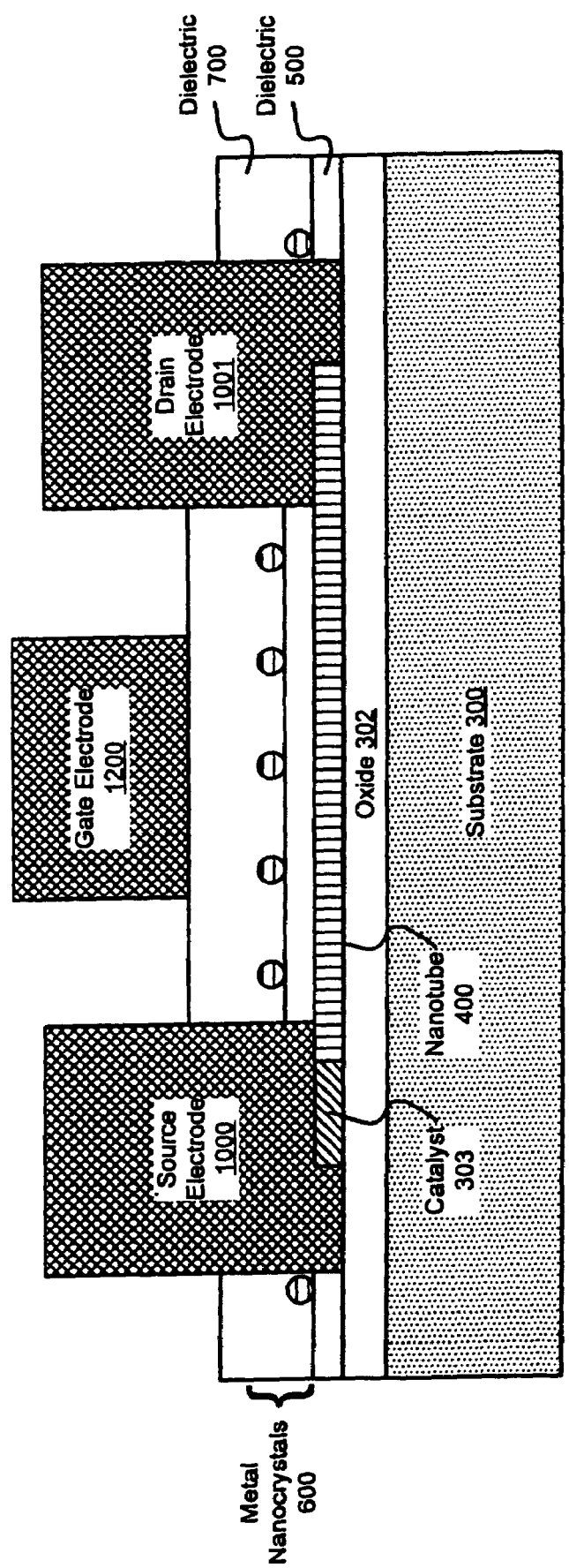
FIG. 12: illustration of the substrate cross section of FIG. 10 following the formation of a top gate electrode

FIG. 12 illustrates the substrate 300 cross section of FIG. 10 following the formation of a gate electrode 1200 on top of the dielectric 700 and between the source electrode 1000 and the drain electrode 1001. In an embodiment, the gate electrode 1200 is tungsten, aluminum, or a silicide. The gate electrode 1200, in combination with the source electrode 1000 and/or drain electrode 1001, generates the electric field that causes the electrons to tunnel through the dielectric 500 layer to the metal nanocrystals 600 or to tunnel from the metal nanocrystals 600 through the dielectric 500 layer depending on a write or erase cycle.

Figure 13:
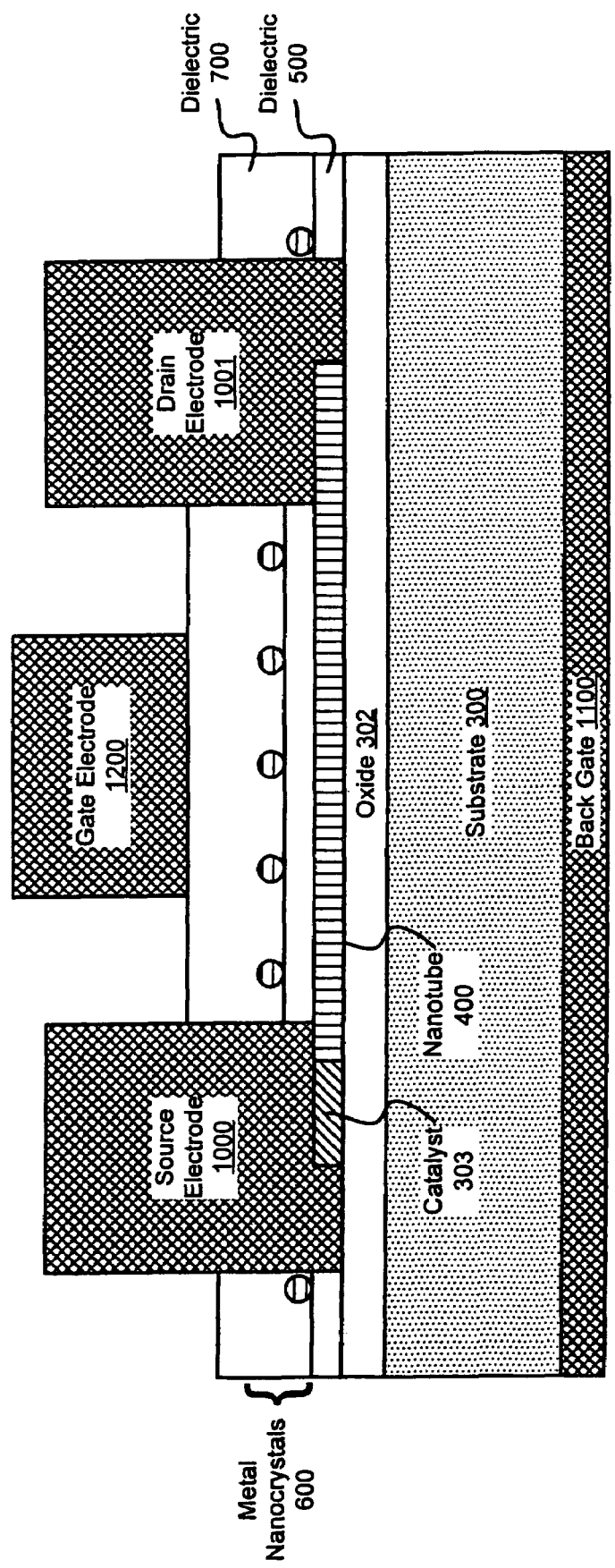
FIG. 13: illustration of the substrate cross section of FIG. 10 following the formation of both a back gate and a gate electrode

FIG. 13 illustrates the substrate 300 cross section of FIG. 10 following the formation of a back gate 1100 and a gate electrode 1200. The back gate 1100 and the gate electrode 1200, in combination with the source electrode 1000 and/or drain electrode 1001, generate the electric field that causes the electrons to tunnel through the dielectric 500 layer to the metal nanocrystals 600 or to tunnel from the metal nanocrystals 600 through the dielectric 500 layer depending on a write or erase cycle.

In operation, for example for a p-type nanotube, the memory element as illustrated by FIG. 12 may have a logical "1" written by applying approximately 5 volts to the gate electrode 1200, approximately 0-0.5 volts to the drain electrode 1001 and 0 volts to the source electrode 1000. With such a bias, charge carriers will be injected (e.g., by direct tunneling or Fowler-Nordheim tunneling) to the metal nanocrystals 600 comprising a floating gate where they will be subsequently stored.

Conversely, for example for a p-type nanotube, to erase (i.e., generate a logical "0") a negative potential of approximately between −5 and −7 volts is applied to the gate electrode 1200, and approximately 0-0.5 volts is applied to the source electrode 1000. The drain electrode connection remains open for the erase process. The charge carriers, by Fowler-Nordheim electron tunneling through the dielectric 500, drain to the source electrode 1000.

To read what logical state is stored, for example for a p-type nanotube, approximately 1-2 volts can be applied to the gate electrode 1200, approximately 0.5 volt applied to the drain electrode 1001, and approximately 0 volts applied to the source electrode 1000. The drain current can thereafter be measured by external circuitry (not illustrated). If the drain current is substantially high, then the device is storing a logical "1." If there is substantially no drain current, the device is storing a logical "0." The read cycle does not alter the charge stored on the metal nanocrystals 600 and is therefore non-destructive.

The increased precision with which the memory element of an embodiment operates also permits storage of multiple bits. For example, the metal nanocrystals 600 may have more than two charge storage states as manifested by multiple detectably different drain currents during a read cycle. Further, the sensitivity of the nanotube 400 channel to multiple levels of stored charge in the metal nanocrystals 600 further contributes to the large memory window (i.e., resistive ratio or drain current ratio in the nanotube 400 channel for a logical "1" versus a logical "0"). Accordingly, for a one bit device, little perturbation is required in the charge stored in the metal nanocrystals 600 to generate a detectible difference in the drain current. This in turn leads to lower power requirements of the device or simplification of external sensor design as it need not be as sensitive.

While an embodiment has been illustrated with a nanotube 400 channel region, it is to be understood that the nanotube may be replaced by a nanowire or nanowires or a combination of nanotubes and nanowires. Nanowires, like nanotubes, exhibit interesting electrical properties and offer the potential for paradigm-shifting trends in device design. In particular, nanowires are semiconductors (e.g., Group IV semiconductors like silicon, germanium, and silicon germanium alloys, and III-V semiconductors like gallium arsenide) that can be relatively easily doped compared to carbon nanotubes to adjust their electrical properties. Like nanotubes, the nanowires can be grown in place, more particularly via a vapor-liquid-solid growth mechanism.

Further, while an embodiment has been described with reference to metal nanocrystals 600, it is to be understood that fullerene nanoparticles may also be utilized to form the discrete charge storage regions of a floating gate. In particular, fullerene nanoparticles such as C36, C60 (i.e., the "Buckyball"), C70, C76, C84, or any other fullerene nanoparticle may store charge as described with reference to metal nanocrystals 600.

One skilled in the art will recognize the elegance of an embodiment in that it combines the benefits of a nanotube channel and a metal nanocrystal floating gate to form an improved non-volatile memory element. One skilled in the art will further recognize that in the highly competitive non-volatile memory market, even small increases in performance can lead to significant market advantages.

What is claimed is:

1. A transistor comprising:
a nanotube channel formed on an oxide;
a first dielectric formed on the nanotube channel; and
a plurality of metal nanocrystals formed on the first dielectric adjacent to the nanotube channel, wherein the plurality of metal nanocrystals form an array of discrete floating gates.

2. The transistor of claim 1 further comprising:
a second dielectric formed on the first dielectric and on the metal nanocrystals.

3. The transistor of claim 2 further comprising:
a first electrode coupled to a first end of the nanotube channel; and
a second electrode coupled to a second end of the nanotube channel.

4. The transistor of claim 3 further comprising:
a gate electrode formed on the second dielectric substantially between the first electrode an the second electrode.

5. A method comprising:
forming a nanotube channel on an oxide;
forming a first dielectric on the nanotube channel; and
forming a plurality of metal nanocrystals on the first dielectric adjacent to the nanotube channel, wherein the plurality of metal nanocrystals form an array of discrete floating gates.

6. The method claim 5 further comprising:
forming a second dielectric on the first dielectric and on the metal nanocrystals.

7. The method of claim 6 further comprising:
forming a first electrode coupled to a first end of the nanotube channel; and
forming a second electrode coupled to a second end of the nanotube channel.

8. The method of claim 7 further comprising:
forming a gate electrode on the second dielectric substantially between the first electrode an the second electrode.

* * * * *

UNITED STATES PATENT AND TRADEMARK OFFICE
CERTIFICATE OF CORRECTION

PATENT NO. : 7,629,639 B2
APPLICATION NO. : 11/599643
DATED : December 8, 2009
INVENTOR(S) : Zhang et al.

Page 1 of 1

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 184 days.

Signed and Sealed this

Twenty-first Day of December, 2010

David J. Kappos
*Director of the United States Patent and Trademark Office*